United States Patent
Kolis et al.

(10) Patent No.: US 9,469,915 B2
(45) Date of Patent: *Oct. 18, 2016

(54) HYDROTHERMAL GROWTH OF HETEROGENEOUS SINGLE CRYSTALS EXHIBITING AMPLIFIED SPONTANEOUS EMISSION SUPPRESSION

(71) Applicant: Clemson University, Clemson, SC (US)

(72) Inventors: Joseph Kolis, Central, SC (US); Colin McMillen, Liberty, SC (US)

(73) Assignee: Clemson University Research Foundation, Clemson, SC (US)

( * ) Notice: Subject to any disclaimer, the term of this patent is extended or adjusted under 35 U.S.C. 154(b) by 317 days.

This patent is subject to a terminal disclaimer.

(21) Appl. No.: 13/923,868

(22) Filed: Jun. 21, 2013

(65) Prior Publication Data

US 2013/0344277 A1  Dec. 26, 2013

Related U.S. Application Data

(60) Provisional application No. 61/663,090, filed on Jun. 22, 2012.

(51) Int. Cl.
*C30B 7/10*   (2006.01)
*C30B 29/34*  (2006.01)
(Continued)

(52) U.S. Cl.
CPC ............ *C30B 7/10* (2013.01); *C30B 29/28* (2013.01); *C30B 29/30* (2013.01); *C30B 29/34* (2013.01);
(Continued)

(58) Field of Classification Search
CPC .. H01S 3/1611; H01S 3/1618; H01S 3/1621; H01S 3/1623; H01S 3/1691; H01S 3/1696; H01S 3/1698; Y10T 428/21; Y10T 428/219
See application file for complete search history.

(56) References Cited

U.S. PATENT DOCUMENTS 3,505,239 A    4/1970 Mazelsky et al.
4,305,778 A   12/1981 Gier et al.
(Continued)

FOREIGN PATENT DOCUMENTS

EP    0065382 A1   11/1982

OTHER PUBLICATIONS

Armstrong et al., "Novel composite structure Nd:YAG gain media for high power scaling of side-pumped configurations", *Optics Communications*, (2000), 175, pp. 201-207.
(Continued)

*Primary Examiner* — Gerard Higgins
(74) *Attorney, Agent, or Firm* — Dority & Manning, P.A.

(57) ABSTRACT

Single crystals are described that contain several regimes within the crystal that perform different functions related to the enhanced performance of a laser gain medium. At least one regime of the single crystals can be utilized to suppress amplified spontaneous emission and parasitic oscillation in a laser gain medium. A single crystal can include core and cladding regions, the cladding region providing amplified spontaneous emission suppression. The core region of the crystal can include as dopant one or more ions that take part in the lasing when suitably pumped. The amplified spontaneous emission suppression region can include as dopant one or more ions that can prevent additional spontaneous emission that can to depletion of the upper laser states, thus reducing laser performance including one or more ions that absorb spontaneously emitted photons and/or a higher concentration of the active lasing ions of the core.

16 Claims, 3 Drawing Sheets

(51) Int. Cl.
*H01S 3/16* (2006.01)
*C30B 29/28* (2006.01)
*C30B 29/30* (2006.01)
*H01S 3/06* (2006.01)

(52) U.S. Cl.
CPC ........... *H01S 3/0612* (2013.01); *H01S 3/1691* (2013.01); *H01S 3/0604* (2013.01); *H01S 3/0606* (2013.01); *H01S 3/1611* (2013.01); *H01S 3/1643* (2013.01); *H01S 2301/02* (2013.01); *Y10T 428/21* (2015.01)

(56) References Cited

U.S. PATENT DOCUMENTS

| | | |
|---|---|---|
| 5,066,356 A | 11/1991 | Ferretti et al. |
| 5,119,382 A | 6/1992 | Kennedy et al. |
| 5,394,413 A | 2/1995 | Zayhowski |
| 5,441,803 A | 8/1995 | Meissner |
| 5,495,494 A | 2/1996 | Molva et al. |
| 5,502,737 A | 3/1996 | Chartier et al. |
| 5,563,899 A | 10/1996 | Meissner et al. |
| 5,761,233 A | 6/1998 | Bruesselbach et al. |
| 5,846,638 A | 12/1998 | Meissner |
| 6,025,060 A | 2/2000 | Meissner |
| 6,347,109 B1 | 2/2002 | Beach et al. |
| 6,834,070 B2 | 12/2004 | Zapata |
| 6,845,111 B2 | 1/2005 | Sumida et al. |
| 6,944,196 B2 | 9/2005 | Wittrock |
| 6,973,115 B1 | 12/2005 | Ferrand et al. |
| 7,203,209 B2 | 4/2007 | Young et al. |
| 7,211,234 B2 | 5/2007 | Kolis et al. |
| 7,374,616 B2 | 5/2008 | Kolis |
| 7,540,917 B2 | 6/2009 | Kolis et al. |
| 7,563,320 B2 | 7/2009 | Kolis et al. |
| 7,591,896 B2 | 9/2009 | Kolis et al. |
| 7,731,795 B2 | 6/2010 | Kolis et al. |
| 9,014,228 B1* | 4/2015 | Kolis et al. ............ 372/41 |
| 2005/0200235 A1 | 9/2005 | Higuchi et al. |
| 2005/0226303 A1 | 10/2005 | Suzudo et al. |
| 2007/0071059 A1 | 3/2007 | Afzal et al. |
| 2007/0098024 A1 | 5/2007 | Mitchell |
| 2007/0253453 A1 | 11/2007 | Essaian et al. |
| 2009/0041067 A1 | 2/2009 | Meissner et al. |
| 2010/0189619 A1 | 7/2010 | Kolis et al. |
| 2013/0343715 A1* | 12/2013 | Kolis et al. ............ 385/131 |

OTHER PUBLICATIONS

Azrakantsyan et al., "Yb3+: YAG crystal growth with controlled doping distribution", *Optical Materials Express*, (2012), 2(1).

Degnan, "Optimization of Passively Q-Switched Lasers" *IEEE Journal of Quantum Electroic*, 31, 11, (1995) pp. 1890-1901;.

Forbes et al., "The hydrothermal syntheseis, solubility and crystal growth of $YVO_4$ and $Nd:YVO_4$", *Journal Crystal Growth*, 310 (2008), pp. 4472-4476.

Feldman et al., "Dynamics of chromium ion valence transformations in Cr, Ca:YAG crystals used as laser gain and passive Q-switching media", *Optical Materials*, (2003), 24, pp. 333-344.

B. Ferrand, et al., "Liquie phase eiptaxy: A versatile technique for the development of miniature optical components in single crystal dielectric media", *Optical Materials*, 11, (1999), pp. 101-114.

Huang et al., "Nd: YVO4 single crystal fiber growth by the LHPG method", J of Crystal Growth 229 (2001) 184-187.

Kolb, et al., "Phase Equilibria of $Y_3Al_5O_{12}$, Hydrothermal Growth of $Gd_3Ga_5O_{12}$ and Hydrothermal Epitaxy of Magnetic Garnets" *Journal of Crystal Growth*, 29, (1975), pp. 29-39.

R.A. Laudise, J.W. Nielson, *Solid State Phys.* 12 (1961) 149-222.

Mao et al., "High Efficient Laser Operation of the High-Doped Nd:YAG Crystal Grown by Temperature Gradient Technology", Chin.Phys.Lett. 19 (9), 2002, 1293-1295.

McDonald et al., "Reducing thermal lensing in diode-pumped laser rods", *Optics Communications*, (2000), 178, pp. 383-393.

Mill, *Sov. Phys. Crystallogr.* 12 (1967) 195.

Okhrimchuk, et al., "Performance of YAG:$Cr^{4+}$ laser crystal" *Optical Materials*, 3, (1994) pp. 1-13.

Puttbach, et al., *J. Phys. Chem. Solids*, Suppl. 1, (1967) 569-571.

Song et al., Growth of composite sapphire/Ti:sapphire by the hydrothermal method, *J. Crystal Growth*, 277, (2005), pp. 200-204.

Zayhowski, "Microchip Lasers", *Optical Materials*, 11 (1999) pp. 255-267.

Zayhowski, "Q-switched microchip lasters find real-world application" *Laser Focus World*, Aug. (1999), pp. 129-136.

Citation of Patent Applications—Related Applications Form.

* cited by examiner

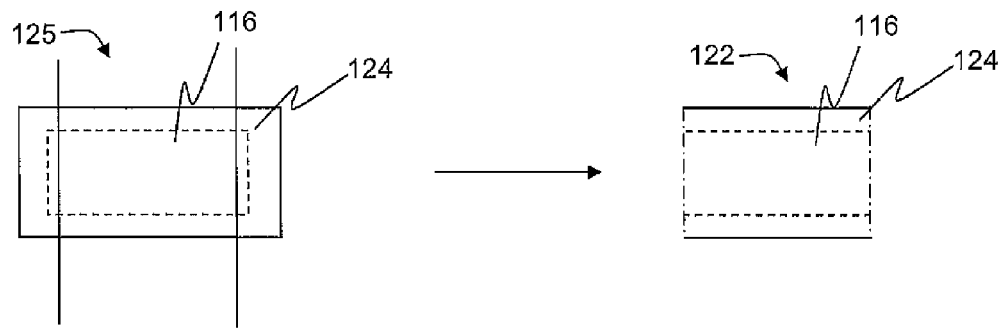
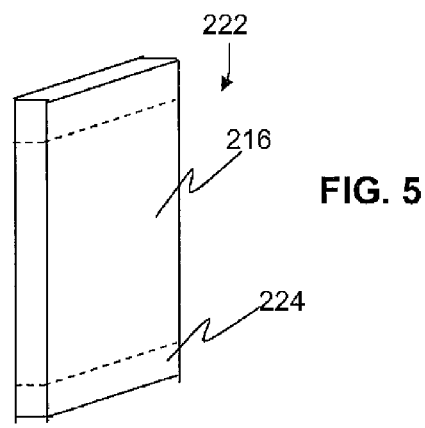
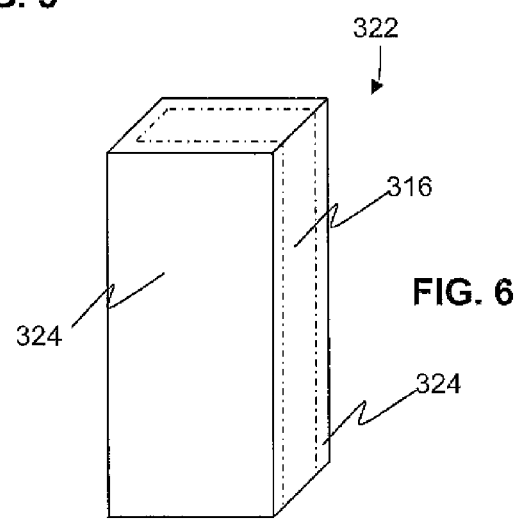
FIG. 4
FIG. 5
FIG. 6

HYDROTHERMAL GROWTH OF HETEROGENEOUS SINGLE CRYSTALS EXHIBITING AMPLIFIED SPONTANEOUS EMISSION SUPPRESSION

CROSS REFERENCE TO RELATED APPLICATION

This application claims filing benefit of U.S. Provisional Patent Application Ser. No. 61/663,090 having a filing date of Jun. 22, 2012, which is incorporated herein by reference.

STATEMENT REGARDING FEDERALLY SPONSORED RESEARCH OR DEVELOPMENT

This invention was made with government support under Grant No. FA9550-07-1-0566 awarded by the United States Air Force/Air Force Office of Scientific Research and under Grant No. DMR 0907395 from the National Science Foundation. The government has certain rights in the invention.

BACKGROUND

Typically, a solid state laser cavity contains a host material that is doped with a small amount of an activator ion. This doped material is generally called the laser gain medium (LGM) of a device. The LGM can be pumped by a light source such as a flash lamp or more commonly, a diode laser of suitable frequency. The light from the pump is absorbed by the LGM creating a population inversion that causes stimulated emission of coherent light. The LGM is typically placed between two or more mirrors that internally reflect the pump light and create standing waves of the coherent light. The mirrors can be in the form of external self-standing objects with the LGM between them or dielectric coatings deposited directly on the faces of the LGM crystal. This arrangement forms the resonator cavity of a device. The output light can be in the form of continuous or pulsed emission of coherent light.

Coherent light is generally understood to be photons that all have the same wavelength with the same phase and propagating along the same vector. Thus, all of the light emitted from the laser cavity desirably propagates in the same direction. This coherent stimulated emission is in contrast to the random, non-directional propagation that results from spontaneous emission of photons that can also occur in the LGM during the lasing process.

The wavelength of spontaneously emitted photons is very nearly identical to that of those emitted as part of the lasing process. Thus, as the spontaneously emitted photons pass through the lasing crystal, they can serve to induce further random emission from the upper lasing state, which can deplete the population inversion necessary for lasing. In addition, the randomly propagating spontaneously emitted photons can reflect from the edges of the crystal and back into the LGM, further inducing random emission from the excited state and further depopulating the upper lasing levels. This effect is termed amplified spontaneous emission (ASE) and can seriously reduce the power and efficiency of the laser gain medium. In addition, efficient reflectance of spontaneously emitted photons from the edges of the LGM can induce randomly oriented standing waves, creating modes that severely deplete the upper lasing states. This effect is called parasitic oscillation and is an offshoot of ASE. Both phenomena can have a negative effect on laser performance. In fact, severe depletion of power and efficiency of the laser device can occur if ASE is not suppressed.

ASE can be particularly acute in high power systems such as thin disk lasers, devices with very demanding performance standards like microlasers (e.g., end-pumped microlasers) that employ relatively low levels of pumping power to maintain compactness, and systems that include LGM with long path lengths (e.g., side bonded lasers, slab lasers, zig zag lasers, etc.). The effect can be particularly severe for three-level or quasi-three level lasing where it is more difficult to maintain a population inversion in the upper lasing level. Quasi-three level laser ions have considerable thermal population of the lower lasing state since it is not energetically well separated from the actual ground state. Therefore, to achieve population inversion a high pump power is necessary, and ASE contribution to the depopulation of the upper lasing level can severely decrease lasing performance. In addition, the extra pumping power necessary to achieve population inversion adds increased thermal load to the system.

Attempts to eliminate or minimize ASE and parasitic oscillations include development of systems that allow for absorbance of the photons resulting from the spontaneous emission. Since these photons have essentially the same wavelength as the desired lasing wavelength, any absorbing species must be on the edge of the LGM and not in the path of the pump beam or the wave path of the lasing action. This region containing the absorbing ion is often called edge cladding and can be formed of the same material as the LGM host material or a different material. Typically it is doped with a metal ion that can absorb the ASE photons with subsequent thermal relaxation. Another variation on this concept is for the edge cladding of the LGM to be formed to have a significantly larger concentration of the actual activator ion than is doped in the lasing region of the LGM. The large concentration of the activator ion insures that it will absorb the ASE photons but never achieve population inversion so will generally relax by a benign process like thermal emission. These approaches have led to the development of LGM that include different zones in the LGM.

Several approaches have been directed to development of an LGM that includes edge cladding whereby the edge cladding is doped with a different metal ion than the lasing ion or a different concentration of the lasing ion than in the central lasing region of the LGM. Most of these involve some variation of diffusion bonding of a separate edge cladding slab to the central LGM solid. Meissner, et al. (J. App. Phys. 1987, 62, 2647) describe a process for diffusion bonding of a vitreous lead aluminosilicate edge cladding doped with $Cu^{2+}$ ions to an $Nd^{3+}$ doped garnet host, $Gd_3Sc_2Ga_3O_{12}$ (GSGG). The $Cu^{2+}$ ions in the edge cladding absorb photons of 1064 nm wavelength, which is the lasing wavelength of the $Nd^{3+}$ ions, and these are responsible for ASE and parasitic oscillations in the Nd:GSGG LGM.

U.S. Pat. No. 7,382,818 to Sumida, et al. describes diffusion bonding of slabs directly to an LGM. Multiple slabs are diffusion bonded in succession after corners and edges are cut off so they can be polished flat before another slab is diffusion bonded to the LGM. U.S. Pat. Nos. 5,441,803 and 5,846,638, both to Meissner, describe a general method of bonding separate slabs together through thermal diffusion for formation of composite optical and electro-optical devices. U.S. Pat. No. 4,849,036 to Powell, et al. describes laser discs that include edge cladding, with the edge cladding bonded to the LGM using an epoxy resin. U.S. Pat. No. 7,609,741 and U.S. Published Patent Application No. 2010/0009475 both to Vetrovec describe the sintering of preforms of ceramic shapes to form a product having distinct zones.

Several criteria are of importance for the successful combination of separate central and cladding regions in an LGM. For instance, in addition to being able to absorb the stray spontaneously emitted photons to prevent their amplification, the edge cladding must have a similar refractive index as the main body of the LGM. If the refractive index difference between the cladding and the central body of the LGM is too large, the ASE photons may not penetrate into the edge cladding and may instead reflect off the interface back into the central portion of the LGM and induce ASE.

The edge cladding must have additional similar physical characteristics as the remainder of the LGM, including such factors as thermal expansion, thermal conductivity and optical damage threshold. Otherwise, the cladding material may crack or separate from the remainder of the LGM during lasing operation. Also the cladding must be robust toward the heat from the pump beam and absorption.

What are needed in the art are methods for forming LGM that can exhibit little or no ASE. For instance, what are needed are LGM that successfully incorporate multiple crystal regimes. A low temperature, facile process that can provide a monolithic heterogeneous LGM including an ASE suppression regime, for instance at an edge cladding, that has similar physical characteristics as is found in the interior of the LGM (e.g., in the path of the pump beam or the wave path of the lasing action) for use in a laser cavity would be of great benefit.

SUMMARY

According to one embodiment, a method for forming a monolithic heterogeneous single crystal is disclosed. The method is a hydrothermal growth method that can include heating and pressurizing an aqueous solution held within a reactor to develop a temperature differential between a first zone of the reactor and a second zone of the reactor. The reactor contains a feedstock in the first zone and a seed crystal in the second zone. For instance, the seed crystal can include the host material and an active lasing ion dopant. The feedstock includes a source for forming the same host material as the host material of the seed crystal and also can include a source for an ASE suppression ion. Upon heating and pressurizing the contents of the reactor, growth of an ASE suppression region is initiated on the seed crystal and the monolithic heterogeneous single crystal can be formed. The formed single crystal will include a first region that corresponds to the seed crystal and a second region that corresponds to the ASE suppression region.

Also disclosed is a monolithic heterogeneous single crystal that can be formed according to the process. For instance, the monolithic heterogeneous single crystal can include a first region and a second region, the first region and the second region including the same host material, the first region including an active lasing ion dopant and the second region including an ASE suppression ion dopant.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which:

FIG. 4 is a schematic diagram of another method for forming a single crystal including multiple crystal regimes as described herein.

FIG. 5 is one embodiment of a single crystal including multiple crystal regimes as described herein.

FIG. 6 is another embodiment of a single crystal including multiple crystal regimes as described herein.

Figure 1:
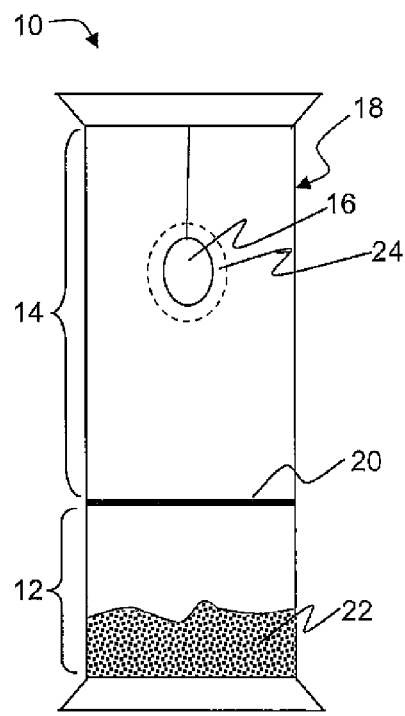
FIG. 1 is a schematic diagram of one embodiment of a hydrothermal growth system as described herein.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

In general, the present disclosure is directed to single crystals that contain several regimes within the crystal that perform different functions related to the enhanced performance of the laser gain medium. More specifically, disclosed are single crystals that can be utilized as an LGM and that can suppress ASE and parasitic oscillation in the LGM, with the result that a laser incorporating the LGM can have improved power and efficiency.

The monolithic single crystal can include core and cladding regions, the cladding region providing ASE suppression. The core region of the crystal can include as dopant one or more ions that take part in the lasing when suitably pumped. The ASE suppression region, generally at one or more outer edges of the crystal, can include as dopant one or more ions that can prevent additional spontaneous emission that can add to depletion of the upper laser states, thus reducing laser performance. For instance, the ASE suppression region can include as dopant one or more ions that absorb spontaneously emitted photons and/or a higher concentration of the active lasing ions of the core.

Also disclosed is a facile formation process that can be utilized to form the monolithic single crystals and can thus be utilized to economically improve laser performance in a wide variety of laser designs and devices.

In general, a method comprises a hydrothermal growth technique for the growth of differing epitaxial layers on a seed crystal. The seed crystal can be, e.g., a host material doped with a suitable active lasing ion. For example, a $Y_3Al_5O_{12}$ (YAG) or $Lu_2O_3$ host material doped with a lasing ion such as $Nd^{3+}$ or $Yb^{3+}$ can be utilized as a seed crystal. A hydrothermal growth process can be used to grow and develop an ASE suppression region on the seed crystal with controlled thickness. The ASE suppression region can be formed of the same base material as the seed crystal, and can include as dopant an ion that can function to reduce ASE. In one embodiment, the ASE suppression region can include as dopant an absorber ion that can absorb photons spontaneously emitted from the core region. The absorber ion can include any suitable dopant that can absorb the emitted photons. Such a menu is well known to practioners of the art. An example of such a list is provided specifically for Nd emission by Yagi et al. (Journal of Luminescence 121 (2006) 88-94). In addition to or alternative to an absorber ion, the ASE suppression region can include as dopant a significantly larger concentration of the activator ion than is doped in the core region of the LGM. In any case, the ASE suppression region can prevent ASE in the formed LGM. Beneficially, as a bulk single crystal is formed by the process, any difference in refractive index or thermal coefficient of expansion at the core/clad interface can be so miniscule as to be inconsequential.

FIG. 1 illustrates one embodiment of a hydrothermal system 10 as may be utilized in a process. In general, a hydrothermal process involves the use of a superheated aqueous solution (liquid heated above its boiling point) under pressure to cause transport of soluble species of, e.g., a refractory oxide, from a nutrient rich zone 12 to a supersaturated zone 14. As the species is not sufficiently soluble in the superheated water, the species will crystallize, either spontaneously according to primary nucleation or alternatively on a seed crystal 16 located in the supersaturated zone 14.

A process can generally take place within a reactor 18. Depending on the chemical demands of the specific system, a reactor 18 can be lined with a noble metal such as silver, gold, platinum, palladium, etc. For instance, a liner can be a fixed liner or a floating liner. A fixed liner reactor can be in the form of a stand-alone autoclave that is lined with or formed of a desired material and can carry the reactants, products, etc. When utilizing a floating liner, a smaller structure that is lined with or formed of the desired material and containing the reactants can be held or suspended within a larger autoclave. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand alone autoclave reactor with either fixed liner or unlined can generally be between about 1 cm and about 10 cm in a cross sectional dimension and between about 10 cm and about 100 cm in height. A floating liner reactor can generally be smaller, for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the inner wall of the reactor 18. For instance, when considering a silver lined or floating reactor 18, baffle 20 can also be silver or silver lined. Baffle 20 can define at least one hole for passage of solution from the nutrient rich zone 14 to the supersaturated zone 20. A baffle 20 can aid in maintaining a temperature differential between the two zones and can encourage substantially isothermal characteristics in each zone. Baffle 20 can also restrict convective flow between nutrient rich zone 14 and supersaturated zone 20 and can channel the convective flow across the baffle 20 into a desirable geometry.

System 10 can also include heaters, insulators, controllers, etc. as are generally known in the art (not shown on FIG. 1). For example, controllers can be utilized for changing the power delivered to heaters, which can determine the thermodynamic condition of the autoclave. Additionally, though illustrated in a vertical arrangement with the nutrient rich zone 14 below the supersaturated zone 20, this is not a requirement of the disclosed process, and the two zones can be located in any suitable location with regard to one another, for instance in a horizontal or any other angled relationship, as long as a temperature differential between the two can encourage convective flow there between.

The seed crystal 16 can be formed or placed in the growth zone 14 to facilitate crystallization of a dissolved feedstock 22 from a supersaturated solution. According to one embodiment, the seed crystal 16 can be formed of a host material doped with an active lasing ion. For instance, the seed crystal can form the core region of the LGM of the multi-regime product crystal.

The host material can be any crystalline material that is suitable for use in a lasing methodology. One exemplary host material is $Y_3Al_5O_{12}$ (YAG), which is commonly utilized in laser technologies. Though the present discussion often refers to a YAG host material, it should be understood that the disclosure is in no way limited to YAG host materials. Methods can be extended to many other hosts as well. By way of example, hosts such as $YVO_4$ and $M_2O_3$ (where M is Sc, Y or Lu) can be utilized. Numerous other host lattices including $Lu_3Al_5O_{12}$, $Gd_3Ga_5O_{12}$, $Gd_3Sc_2Ga_3O_{12}$, other garnets, oxides, spinels, perovskites phosphates, vanadates (for example $YVO_4$, $GdVO_4$ and others, examples of which are described in U.S. Pat. No. 7,211,234 to Kolis, et al., which is incorporated herein by reference), borates, rare earth sesquioxides (for example $Sc_2O_3$, $Y_2O_3$, $Lu_2O_3$ and others, examples of which are described in U.S. Pat. No. 7,563,320 to Kolis, et al., also incorporated herein by reference), fluorides and other halides are encompassed and host materials are only limited by their stability in hydrothermal fluids, as further described below.

The seed crystal can include as dopant an active lasing ion as is known in the art. By way of example, the seed crystal 16 can include as dopant an active ion such as, but not restricted to, $Nd^{3+}$, $Yb^{3+}$, $Er^{3+}$, $Ho^{3+}$, or $Tm^{3+}$. A variety of other suitable lasing ions known to practitioners can be doped into the LGM as well. An active lasing ion dopant can be included in a host material in an amount according to standard practice, for instance in an amount of from about 0.2 atomic (at.) % to about 10 at. %.

The seed crystal can include as dopant one or more quasi-three level lasing ions such as $Yb^{3+}$ and $Nb^{3+}$. For example $Yb^{3+}$ is typically pumped with wavelengths between 940 and 975 nm and lases at wavelengths near 1028 to 1030 nm. Since it is a quasi-three level lasing ion, it has thermally populated states at the lower lasing level and thus can absorb the resultant 1030 nm photons (from the $^2F_{5/2}$ to $^2F_{7/2}$ states). This does not happen significantly in the lasing region of the LGM since the ions are being strongly pumped and the resultant population inversion makes the $Yb^{3+}$ ions transparent to absorption. However, at the edges or boundaries of the LGM 1030 nm photons can be absorbed by the residual unpumped $Yb^{3+}$ ions. For higher power operation such as in a thin disk configuration the $Yb^{3+}$ ions are pumped strongly so a significant amount of spontaneously emitted 1030 nm photons can be created, and associated ASE can lead to significant reduction on laser efficiency and eventually disk failure. Similarly, the transitions in the $Nd^{3+}$ ion near 945 nm (from the $^4F_{3/2}$ to $^4I_{9/2}$ states) are quasi-three level transitions. Thus ASE suppression may be particularly useful to increase efficiency for these types of lasing ions. The concept is widely applicable over many different lasing ions and wavelengths, however, and these examples are not intended to restrict this disclosure.

The seed crystal 16 can also be a multifunctional material. For example, the seed crystal 16 can be doped with multiple dopants, each of which can provide a different function to the LGM. By way of example, the seed crystal 16 can be doped with $Nd^{3+}$ or $Yb^{3+}$ as well as $Ca^{2+}$ and $Cr^{4+}$. In this embodiment, the $Cr^{4+}$ can serve as a saturable absorbing Q-switch in a co-doped LGM. Such materials have been described previously (see, e.g., S. Zhou, K. K. Lee, Y. C. Chen, S. Li Optics Letters 1993, 18, 511).

A seed crystal may be obtained according to any formation process as is generally known. For instance, a seed crystal can be formed according to a hydrothermal method under transport parameters as previously described (see, e.g., U.S. Pat. Nos. 7,211,234 and 7,563,320 to Kolis, et al., previously incorporated herein by reference), A seed crystal can be grown from a melt according to a liquid phase epitaxy process or according to a vapor deposition process, or alternatively cut from a larger crystal formed according to such a process. Some seed crystals such as YAG and $YVO_4$ materials can be produced by any of the standard growth methods known to practitioners of the art, including melt growth, flux growth, Czochralski pulling, top seeded solution growth, heat exchanger and similar methods.

The disclosed methods can be carried out with a seed crystal of any suitable size, which is generally limited only according to the diameter of the reactor. For instance, a seed crystal can be about 1 mm in thickness, and about 1 cm in diameter, or larger, as desired.

Referring again to FIG. 1, feedstock 22 can include in a powdered form the host material or sources for forming the host material. A feedstock can also include a source for one or more dopants that can prevent ASE. Beneficially, the dopant ion is not generally limited by the hydrothermal method, as virtually all laser active ions can be transported according to a hydrothermal process. For instance, in forming a region of a crystal for use as an ASE suppression region (e.g., a cladding layer), the dopant can be an appropriate ASE absorber ion for the active lasing ion of the core of the LGM. For example, when considering formation of an ASE suppression region on a seed crystal of 1 at. % $Nd^{3+}$ doped YAG, the feedstock 22 can include a source for an $Sm^{3+}$ dopant. The feedstock in such an embodiment can include an $Sm^{3+}$ dopant source such as $Sm_2O_3$, $SmCl_3$ or other such $Sm^{3+}$-containing material. Dopant ion sources as may be included in the feedstock 22 can include oxides, halides, nitrates or any other suitable salt of the dopant.

For any lasing ion, the feedstock can include a source of a suitable dopant ion that would suppress ASE by absorbing at the lasing wavelength of the particular lasing ion, Thus for example, when considering $Yb^{3+}$ doped YAG as the seed crystal, the feedstock can include a source of an absorbing dopant such as $Co^{3+}$ or $Cr^{4+}$ that can absorb spontaneously emitted photons from the $Yb^{3+}$ ion. Alternatively the dopant in the cladding layer can include a large excess (e.g., about 1% to about 5%) $Ca^{2+}/Cr^{4+}$, which absorbs 1030 nm emission strongly but not in sufficient amount to ever become saturated.

The absorbing ion can be any ion that absorbs, scatters, decays or otherwise suppresses spontaneously emitted photons, and/or inhibits reflection of spontaneously emitted photons from the edge of the LGM back into the main body of the LGM and into or near the path of the lasing beam. The identity of the absorbing ion doped into an ASE suppression region is generally a function of the lasing wavelength generated by the LGM. For example if the LGM contains a $Nd^{3+}$ dopant ion and is pumped by an 808 nm diode laser and emits a lasing wavelength around 1064 nm (a common but not exclusive design), the ASE suppression region can be doped with ions that can absorb 1064 nm light. Such ions include but are not limited to $Cu^{2+}$, $Co^{3+}$, $Dy^{3+}$, $V^{3+}$ and $Sm^{3+}$. Once the photons are absorbed by ions in the ASE suppression region at the edge of the LGM, the resultant excited states of the ions typically decay through some benign vibronic effect with minimal emission of any subsequent photons, effectively suppressing ASE and parasitic oscillations.

In another embodiment, alternative to or in addition to a source for an absorbing ion, the feedstock can include a source for the lasing ion, and can include the source in an amount such that the lasing ion will be included in the ASE suppression region in a much higher concentration as compared to the core region of the LGM, e.g., as compared to the concentration of the lasing ion in the seed crystal. For example, the feedstock can include an active lasing ion source in an amount such that the hydrothermally formed ASE suppression region can include the dopant in a concentration that is from about two to about ten times the concentration of the dopant in the seed crystal.

During use, the core or central region of the LGM, which can be designated as the lasing region, is pumped with sufficient pumping power to induce population inversion and become transparent to the emitting photon wavelength during lasing. However, at the boundaries of the LGM, the pump intensity is relatively small so there is no population inversion. Thus, the emitting wavelength is readily absorbed by the high concentration of the dopant ion. Because there is no population inversion, the photons do not lase and eventually decay, minimizing ASE.

Beneficially, through utilization of a hydrothermal growth method, higher concentrations of ASE prevention dopants can be incorporated in a region of a crystal than is possible using conventional melt growth techniques. For instance, $Sm^{3+}$ dopant can be incorporated in the ASE suppression region at levels greater than about 2 at. %, or up to about 25 at. %, Of course, lower or higher dopant concentrations are also encompassed herein. For instance, a dopant can be provided in a host material at a concentration between about 0.1 at. % and up to 100 at. %, or between about 5 at. % to about 25 at. %.

A hydrothermal growth method can eliminate the use of molten flux solutions as are needed for liquid phase epitaxy. By eliminating the fluxes from the growth process, a number of steps can be saved including the need to spin away flux and clean the boules with nitric acid to remove any residual flux. Furthermore, the high temperature solvents utilized in liquid phase epitaxy often contaminate the resultant product with impurities in the flux or the flux themselves. A hydrothermal growth method eliminates the need for highly toxic lead-based solvents that are often the liquid phase epitaxy solvents of choice in YAG and other refractory oxide growth methods.

The aqueous solution used in the hydrothermal process can include a mineralizer that can facilitate dissolution and transport of the feedstock. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ in various concentrations. Control of identity and concentration of a mineralizer can facilitate both the rate and quality of crystal growth. Mineralizers and parameters for their use are well known to those practiced in the art and have been used for the growth multiple electro-optic crystals such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known in the art. In general, mineralizer concentration can be greater than about 1 M, for instance mineralizer concentration can vary between about 1M and about 30M, or even higher in some embodiments. In the case of a YAG base material, carbonate mineralizer can be used, for instance in a concentration between about 2M and about 5M. A process including a feedstock mixture of $Yb_2O_3$ and $Lu_2O_3$ can utilize a hydroxide mineralizer, for instance in a concentration between about 10M and about 30M. In another example, doped $YVO_4$-based material can be grown employing a hydroxide mineralizer at a concentration of between about 1M and about 2M.

During the hydrothermal crystal growth process, a superheated hydrothermal fluid can be contained in the reactor under pressure, typically between about 5 kpsi and about 30 kpsi. Growth and supersaturation control is achieved by the use of a differential temperature gradient across a reactor. Referring again to FIG. 1, a nutrient rich zone 12 can be heated and feedstock 22 can dissolve in the hot hydrothermal fluid. The solution in the nutrient rich zone 12 can become a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build upon the crystal structure of the seed crystal 16. The process will continue until stopped or the feedstock supply is consumed.

Among the advantages of a hydrothermal crystal growth process are the relatively low operating temperatures. For instance, a growth process can generally be carried out with upper temperatures of between about 500° C. and about 650° C., or between about 450° C. and about 650° C., which can be 800° C. to 1200° C. lower than an liquid phase epitaxy method. This can simplify operating conditions and drastically minimize the amount of thermal strain regions of a forming crystal. The thermal gradient between the two zones of a reactor can likewise vary according to specific materials and growth rates desired, but typically can be between about 20° C. and about 100° C.

Another advantage of the hydrothermal growth process is that the feedstock maintains a constant concentration in solution during the growth run. Thus, once a partition coefficient is determined for the doping ion relative to the host, that concentration can be established in the solution using the appropriate concentration of dopant in the feedstock, and a constant concentration of dopant can be maintained in solution and hence throughout the lattice during growth.

In general, growth rate of a developing region can be between about 1 and about 5 microns per hour, or between about 30 and about 150 microns per day. The identity and concentration of a dopant typically has little effect on the rate of layer growth. Rather, the rate of crystal growth can be controlled by the identity and concentration of a mineralizer as well as the temperature gradient across the reactor and the nature of the host material. The relatively slow growth rates possible can be beneficial as this can allow for precise control of the thickness of the forming crystal. For example, a process can reliably grow a region at about 2 microns/hour or about 25 microns/day and can thus be used to grow a region of about 100 microns over four days. Generally, growth rate can vary between about 1 and about 5 microns/hour, with preferred growth conditions for any specific system specific to the particular host lattice. Thus for example, when considering $M_2O_3$ oxide host material, a concentrated hydroxide (about 10M to about 30M) mineralizer can be used and the thermal conditions can be at the high end of the range (lower and upper zones at, e.g., about 600° C. and about 650° C., respectively). In the case of $YVO_4$ a lower concentration (e.g., about 0.1 M to about 2M) hydroxide mineralizer can be used at somewhat lower temperatures (e.g., lower and upper zones at about 400° C. and about 480° C.).

In one embodiment, a feedstock mixture of 30 at. % $Yb_2O_3$ and 80 at. % $Lu_2O_3$ using between about 10M and about 30M hydroxide mineralizer with a temperature differential of about 100° C. between the two zones (about 600° C. and about 700° C. in the two zones) can grow 30 at. % $Yb:Lu_2O_3$ on 10% doped Yb: $Lu_2O_3$ seed crystal at a rate of between about 35 and about 57 microns/hour. Since the seed crystal can be cubic all faces of the seed crystal can grow at the same rate when a seed crystal is chosen to have the same Miller indices (orientation) on all six sides. This can provide a cladding layer containing absorber ions on all faces of the LGM. The cladding layer can then be removed from the pathway of the lasing beam (typically two opposing faces of the crystal) for the final product. This can be done using standard polishing methods well known to workers in the field.

In another embodiment 20% $Sm^{3+}$ doped YAG, or a equivalent mixture of $Sm_2O_3$ $Y_2O_3$ and $Al_2O_3$, can grow on 1% $Nd^{3+}$ doped YAG using between 1 and 8 molar carbonate ($CO_3^{2-}$) mineralizer with a temperature differential of about 40° between the two zones (about 600° C. and about 640° C. in the two zones) at a rate of 10 and 50 microns per hour. The seed crystal can be cubic and can be oriented so all faces will grow at the same rate. Such oriented seed crystals can be prepared and the faces for the laser path can be polished using well-known techniques or alternatively seed crystals are available commercially. In another embodiment, $Sm^{3+}$ doped $YVO_4$ can be grown on $Nd^{3+}$ doped $YVO_4$ using a substrate of $Nd:YVO_4$ and a feedstock of powdered $YVO_4$ intermixed with enough $Sm_2O_3$ sufficient to provide about 25% atomic equivalent $Sm^{3+}$ doped $YVO_4$. This process can employ between about 1M and about 2M hydroxide as a mineralizer and a thermal differential between the two zones of about 100° C. (about 450° C. and about 550° C., respectively). A growth rate of 5-8 microns/hour can grow layers of 25 at. % $Sm:YVO_4$ on the $Nd:YVO_4$ substrate.

Disclosed methods can be readily scaled to large numbers of samples simultaneously so that growth time is not a hindering factor. Moreover, once a process is started it can require little or no operator input over the course of the reaction and can be replicated reliably many times. As such, the total time of growth can be of little consequence in the overall production process.

A process can be a simple single step process and can deposit regions of various shapes such as rods or disks. Typically formed regions can be several hundred microns to multiple (e.g., about 2 to about 10) millimeters thick, though larger or smaller materials can be formed.

A region may be grown on oriented seed faces so that the resultant coherent light emission may be polarized for further manipulation. Alternatively, growth of an epitaxial region can be carried out on a non-oriented seed crystal. For example, a [100] oriented epitaxial region of doped material can be grown on [100] oriented seed crystal to provide a device with controlled polarization of the output beam.

Figure 2:
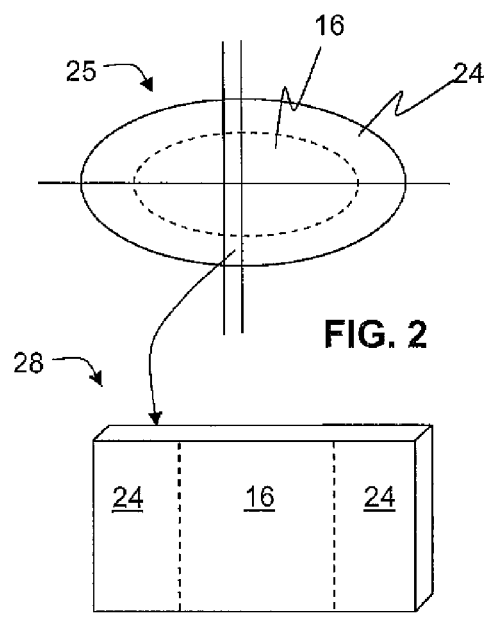
FIG. 2 is a schematic diagram of one embodiment of a method for forming a single crystal including multiple crystal regimes as described herein.

FIG. 2 illustrates one embodiment of a heterogeneous as-formed crystal 25 including adjacent regions including a region 16 formed of a host material doped with an active lasing ion adjacent region 24 that is an ASE suppression region. Region 24 is based upon the same host material, but includes one or more dopants that can prevent ASE. A resultant product crystal 25 can be a large area substrate that can be polished and processed using techniques well known to those in the art. For example, a crystal 25 can be cut as shown by the dashed lines to form a final product crystal 28 for use in a laser cavity. In one embodiment, crystal 28 can be polished and coated with appropriate reflective coatings and cut into many pieces to form a large number of microlaser cavity devices.

Figure 3:
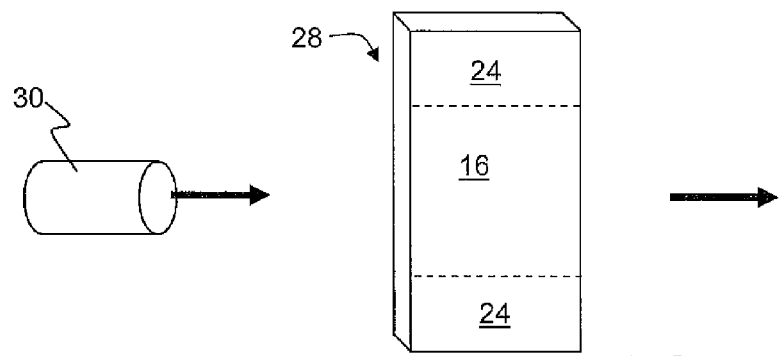
FIG. 3 is one embodiment of a laser system incorporating an LGM that includes an ASE suppression regime in cladding regions of the crystal as described herein.

As illustrated in FIG. 3, during use, a light source 30 such as a flash lamp or diode laser can pump light into crystal 28. Active ions within the core region 16 can absorb the pumped light and create a population inversion that causes stimulated emission of coherent light, and active ions within the ASE suppression regions 24 can absorb or otherwise prevent ASE due to spontaneous emission in the crystal 28.

According to one embodiment, rather than cutting the as-formed crystal to form a product crystal as illustrated in FIG. 2, the as-formed crystal can be processed to form a single product crystal for use in a laser device. For example, as illustrated in FIG. 4, the as-formed crystal 125 can be polished on one or more sides as demonstrated by the demarcation lines on FIG. 4, to form a single product crystal 122 that may be used as an LGM that includes a core region 116 and cladding 124 that can function as ASE suppression regions. During use, a pump beam can access the LGM and the resultant lasing beam can exit.

One advantage of a hydrothermal formation method is that it can be simply and economically scaled to large volume production. A hydrothermal epitaxial growth method can be utilized to grow crystal regions on very long substrates limited only by the length of the reactor. For instance, an original seed crystal with 3×3 millimeter cross sectional dimension and 5 cm length can produce in excess of 15 single ASE clad 3×3×3 mm single crystals (allowing for edge defects and kerf loss during cutting) after only a few days of hydrothermal layer growth. Since multiple such long seeds can be hung in a reactor and the number is only a function of the inner diameter of the reactor, the ability to scale production to large volumes of devices is readily apparent. A hydrothermal process provides very uniform, homogeneous and monolithic layer growth for each region because it grown out of highly mobile and homogenous soluble growth solution, and can be used to reliable develop larger heterogeneous monolithic crystals.

Any suitable polishing process can be utilized to remove portions of the outer cladding 124 of the as-formed crystal 125 from the inner core region 116, for instance using standard techniques well known to practitioners in the field. The portions of the as-formed crystal 125 that are removed can be determined based on the desired laser design and application to be used. For instance, as illustrated in FIG. 4, two opposite faces can have material removed while retaining the cladding 124 on the remaining faces and edges. Moreover, the material removed from the as-formed crystal, for instance in a polishing process, can be used as a seed crystal for an additional growth reaction In one embodiment a plate can have the cladding on both faces of the crystal removed while retaining the cladding 224 on the edges of the plate 216 as shown in FIG. 5. This crystal 222 can serve, for example, as the lasing crystal in a thin disk high-energy laser. Alternatively, the cladding can remain around all four edges of a plate, for instance in forming a thin disk device.

In yet another embodiment illustrated in FIG. 6, a rod 322 can have the added material removed from both ends and one face to create a lasing crystal with the LGM core material 316 exposed on both ends and one side and the cladding material 324 covering the other three sides of the crystal for use, e.g., in a side pumped laser.

Beneficially, it is a relatively simple matter to remove material from any face of an as-formed crystal using polishing technology well known to practitioners of the art. For instance, any number of vertices can be coated on seed crystal of any shape in one reaction. This can save many steps. For example in U.S. Pat. No. 7,382,818 to Sumida, et al., the inventors describe diffusion bonding of slabs to an octagonal LGM rod. Each of the eight steps requires careful cutting and optical polishing followed by diffusion bonding. This is time consuming, expensive and technically very difficult as compared to a one step hydrothermal growth process followed by polishing as described herein.

LGM multi-regime single crystal materials can include, but are not limited to, laser crystals for microlasers, end-pumped rod lasers, side-pumped rod lasers, thin disk lasers or laser amplifiers, etc. Moreover, as the layer growth is epitaxial, meaning it adopts the same structure as the seed, the grown layers can be oriented as desired, for example along the [100] Miller index surfaces, using the terminology well known to experts in the field.

While the core region and an ASE suppression region can be the only crystal regimes of a multi-regime LGM, this is not a requirement. Modern solid-state lasers often employ several other single crystal regimes that serve a series of purposes including thermal management, mechanical strength increase, waveguiding, Q-switching, harmonic generation and the like. These regimes can be included in a device and can occur in the form of a series of separate and distinct single crystals, or alternatively, can occur in the form of layers or films that have similar lattice structures and dimensions, but with slightly different chemical compositions where the different compositions reflect the different functions. Accordingly, in one embodiment, a crystal including an ASE suppression region can be further processed and additional layers can be grown on the crystal.

For instance, in one embodiment the as-formed, multi-regime crystal can be used again as a seed crystal in another hydrothermal growth process to grow any number of additional layers with additional optical functionalities. For example, an as-formed crystal 25 as illustrated in FIG. 2, which is a single crystal containing an inner regime 16 of, e.g., YAG doped with $Nd^{3+}$ and an outer cladding ASE suppression regime 24 doped with an appropriate amount of, e.g., $Sm^{3+}$, (5-20% for example) can serve as a seed for another hydrothermal reaction.

According to one embodiment, the multi-regime crystal can be processed prior to additional hydrothermal growth. For example, two opposite ends of the crystal can be polished to remove the cladding. The polished crystal can then be exposed to another hydrothermal growth reaction with a feedstock of undoped host material (e.g., YAG). After suitable growth reaction, undoped host material can be deposited on the exposed ends of the crystal providing undoped endcaps. The formed product can serve as a laser cavity for a diode pumped solid state laser with the endcaps serving to minimize any cracking of thin dielectric coating, thermal lensing or other undesirable thermal effects. Hydrothermal growth of undoped zones as endcaps has been described in co-owned U.S. patent application Ser. No. 12/832,119, which is incorporated herein by reference. Any undesired growth of further layers, for instance growth on the ASE suppression region, can be simply polished off using standard polishing technology.

Undoped endcap layers can be beneficial in promoting thermal management for the formed materials. Thermal management is a significant matter particularly with regard to high-energy solid-state lasers. For instance, thermal lensing and surface distortion become a significant matter for higher power applications during which residual heat buildup can be localized in the active lasing cavity in a non-uniform fashion. This can lead to irregular thermal expansion of the lattice and can reduce the quality of the beam. Such localized heating can also change the refractive index of the material leading to gradient index (GRIN) behavior, which leads to beam defocusing. In addition, heating from the pump can induce cracking or other damage to the host crystal. This is a particularly sensitive issue because the damage is often induced at small defects at the crystal surface or the near subsurface that are especially sensitive to thermal damage. Another problem is distortion or cracking of any thin coating or film, such as Reflective or Anti Reflective coating applied to the surface of the crystal due to thermal deformation. Applied coatings are typically very thin and especially sensitive to surface damage.

One method for solving such thermal problems is to provide a moderately thick undoped host lattice regime as a portion of the doped lasing crystal. For example undoped regions of the host crystal can be formed to serve as endcaps. In this configuration the pump light will penetrate the undoped region of the crystal for a certain distance before it begins to get absorbed by the activator ions. The relatively thick endcap can dissipate heat buildup and minimize any distortion at the crystal face. Accordingly, in one embodiment, a hydrothermal process can include the growth of undoped endcaps on a product crystal. Moreover, the undoped endcap layers can be deposited either before or after the formation of the ASE suppression region, generally depending on the desired applications and subsequent uses of the product materials.

In another embodiment, the formed single crystal including an ASE suppression regime can be subjected to a hydrothermal growth process utilizing a feedstock that contains a suitable concentration of ions that can serve as saturable absorbers for Q-switching. For example, a single crystal including a YAG host material, $Nd^{3+}$ active ions in a core region, and $Sm^{3+}$ absorber ions in an ASE suppression region can be subjected to a polishing process to remove the ASE suppression region from areas of the crystal followed by a hydrothermal growth process utilizing a feedstock that contains an appropriate amount of $Cr^{4+}$ ions. After hydrothermal growth a layer of YAG doped with $Cr^{4+}$ can be grown on the crystal, and particularly on the polished areas of the crystal that do not include the $Sm^{3+}$ doped material. Any excess of the $Cr^{4+}$-doped layer can be simply removed by polishing after growth, using standard polishing methods.

Through multiple iterations of hydrothermal growth processes, a single crystal can be formed that can include a large variety of regimes. For example, in three growth reactions a single crystal can be produced that contains an LGM core regime, an ASE suppression regime, endcaps of undoped material to minimize thermal lensing and coating damage, and a Q switching regime. As all of the regions are part of a monolithic single crystal, there will be minimal thermal expansion problems or refractive index differences.

The process can be extended to any material that can be grown as a single crystal using hydrothermal growth technology using any dopants that can successfully occupy one of the host lattice sites. It can also be extended to any shape or size crystal that can fit in a hydrothermal autoclave.

The hydrothermal methods can be utilized to form highly doped regions of a heterogeneous crystal. For instance a region can include a dopant in a concentration of between about 2 at. % and about 10 at. % doping of the host material of the region, or between about 10 at. % and about 50 at. % of the cladding material of the region.

Additional regions can be grown on a crystal using a feedstock comprised of the desired reactants. In one embodiment, additional layers can be grown in a separate reactor following formation of a previous layer either before or after cladding removal from selected faces, to prevent any contamination from the dopant in adjacent layers, though this is not a requirement of disclosed processes. Thus, in this embodiment, the seed crystal of the additional process can be a heterogeneous, monolithic crystal formed in a previous process.

Several prophetic examples will now be described in more detail, though the disclosure is not to be limited to any examples, and the prophetic examples are provided merely as further description of features of the disclosed subject matter.

In one embodiment, a crystal of YAG co-doped with 1% $Nd^{3+}$ and 0.03% $Cr^{4+}$ and an equimolar amount of $Ca^{2+}$ for charge balance, can be used as a seed crystal. The amount of $Nd^{3+}$ dopant can vary over a wide range, from as low as about 0.2 at. % to as high as about 4 at. %. The amount of $Cr^{4+}$ can vary widely from about 0.01 at. % to about 0.1 at. %. A feedstock can include a mixture of YAG and an $Sm^{3+}$ containing material such as $Sm_2O_3$, or $Sm^{3+}$ doped YAG powder. The amount of $Sm^+$ can range in one embodiment from about 5 at. % to about 25 at. %. The feedstock can be located in a reactor in conjunction with an appropriate mineralizer at appropriate thermal conditions to encourage transport and a growth reaction that can provide an epitaxial cladding layer of about 25 at. % Sm:YAG on an about 1% Nd:0.03% $Cr^{4+}$ co-doped YAG substrate which could serve as LGM. Such a product could be useful for, e.g., diode pumped solid-state laser cavity to form a Q switched pulsed laser device with ASE suppression.

In another embodiment, a layer of $Sm^{3+}$ doped $YVO_4$ can be grown on $Nd^{3+}$ doped $YVO_4$ using a seed crystal of about 3% Nd:$YVO_4$ and a feedstock of powdered $YVO_4$ intermixed with enough $Sm_2O_3$ sufficient to provide the desired atomic equivalent $Sm^{3+}$ doped $YVO_4$ on the substrate, e.g., about 20 at. %. A product crystal can include about 25 at. % Sm:$YVO_4$ on an about 3% Nd:$YVO_4$ substrate. This material could be useful as, for example, a diode pumped vanadate microlaser with ASE suppression.

According to another embodiment, a crystal of about 10% $Yb^{3+}$ doped lutetia (Yb:$Lu_2O_3$) can be used as a seed crystal. The amount of $Yb^{3+}$ dopant can vary over a wide range, from as low as about 1 at. % to as high as about 15 at. %. A feedstock can include a mixture of $Yb_2O_3$ and $Lu_2O_3$, which contains significantly greater amount of $Yb^{3+}$ concentration of $Yb^{3+}$ than in the seed (e.g., about 25 at. % $Yb^{3+}$ and about 75 at. % $Lu^{3+}$). This amount can range from about 15 at. % to as large as 100 at. % $Yb^3$. The feedstock can be located in a reactor in conjunction with an appropriate mineralizer at appropriate thermal conditions to encourage transport and a growth reaction that can provide an epitaxial layer of about 25 at. % Yb:Lu$_2$O$_3$ on the 10% Yb doped Lu$_2$O$_3$ substrate. Such a product could be useful for, e.g., a high average power laser cavity with ASE suppression. Alternatively the product could be used as a laser amplifier wherein one or more of the products could be used in succession after the laser oscillator cavity. Each amplifier crystal is a single pass crystal, each serving to increase the power of the lasing beam as is well known to practitioners.

As a variation of this theme, the feedstock layer can also be co-doped with a small amount of Er$^{3+}$ ion in addition to the higher concentration of Yb$^{3+}$ After hydrothermal growth, the cladding layer could contain a relatively high concentration of Yb (perhaps about 15-25 at. %) along with a small amount of Er$^{3+}$ (perhaps 0.01-2% at. Er$^{3+}$). The Er$^{3+}$ would serve to catalyze the relaxation of the Yb$^{3+}$ excited state after absorption of the ASE increasing the rate of ASE photon suppression.

In another embodiment the seed crystal can be another typical host material such as YAG or LuAG doped with a typical lasing ion such as 10 at. % Yb$^{3+}$ or 0.5 at. % Nd$^{3+}$ as non-limiting examples. A plate shaped seed with non-limiting dimensions of about 1-2 cm with a thickness of about 1-5 mm can be placed in a hydrothermal autoclave with a feedstock containing the host material along with a suitable ASE suppression ion (e.g. Co$^{3+}$, Sm$^{3+}$ Yb$^{3+}$/Er$^{3+}$, etc.). After suitable hydrothermal epitaxial growth as described above, an ASE suppression region of about 1-2 mm thickness is grown on all faces of the seed, Subsequent polishing of the larger faces can remove unwanted areas of the cladding layer. This can create a product suitable for use as a high average power laser or laser amplifier In another embodiment the seed crystal can be in the shape of a bar. As a non-limiting example a seed crystal bar can have the dimensions of about 3×3×15 mm. It can be formed of, for example, 1 at. % Nd:YAG. The seed crystal can be placed in a hydrothermal reactor as described above with an appropriate feedstock containing a suitable amount of an Sm$^{3+}$ source to provide a cladding layer of approximately 15 at. % Sm:YAG. After growth, the cladding layer can cover the entire seed crystal. Following, the cladding layer can be removed from both ends of the bar using polishing methods well known to practitioners. In addition, the cladding layer can be removed from one side of the bar to create one open face with dimensions approximately 3×15 mm, with the remaining three faces still covered by Sm; YAG cladding layer. Such a product can be used as a LGM in a side pumped laser device, whereby multiple diodes can be arranged to pump the LGM.

In another example, an oriented layer of lasing material can be grown. For instance, an oriented layer such as the [100] layer of Nd$^{3+}$ or Yb$^{3+}$ doped YAG crystal can be used as a seed. The doped crystal can be cut and polished to a [100] orientation and used as a seed in a hydrothermal autoclave as described herein. A feedstock of YAG or Y$_2$O$_3$ and Al$_2$O$_3$ doped with suitable concentration of an ASE suppressor ion (typically but not limited to Co$^{3+}$, Sm$^{3+}$, Dy$^{3+}$ or large excess of either Yb$^{3+}$ or Ca$^{2+}$/Cr$^{4+}$ as described above) can be placed in the autoclave and a doped epitaxial cladding layer can be grown as epitaxial layers on the substrate essentially as a continuous part of the same crystal lattice as the substrate, distinguishable only by the dopant in the activator regime. Thus the epitaxial layers will adopt the same orientation as the substrate (for example [100]) allowing for control of polarization of the resultant beam. The product can be suitably cut, polished and coated with appropriate multi-dielectric films to create a single crystal that can serve as a laser cavity that can be oriented to align a crystallographic axis with a polarized pump beam. This can form an efficient absorber suitable for subsequent non-linear applications for example.

In another embodiment a thin disk laser crystal can be fabricated. In thin disk lasers it is often desirable to have a thin layer region doped with activator ions on a thicker undoped region that serves as a substrate. The activator region is a thin disk so as to maximize surface contact with a heat sink. The undoped part of the crystal acts as a substrate to add mechanical strength and act as an interface with a heat sink or cooling zone. It may also be desirable to add an additional undoped layer of crystal to the opposite side of the cooling layer to minimize thermal distortion of the LGM region. Such devices have been described in e.g., U.S. Pat. No. 6,347,109 to Beach, et al. and U.S. Pat. No. 6,834,070 to Zapata, which are incorporated herein by reference.

Figure 7A:
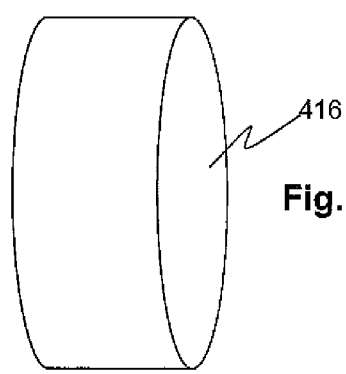
FIG. 7A-FIG. 7F illustrate a method for forming a multifunctional thin disk lasing crystal include an ASE suppression regime.
Figure 7B:
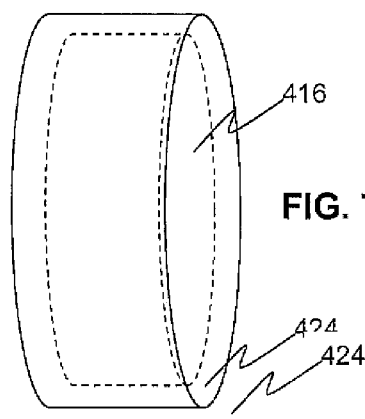
Figure 7C:
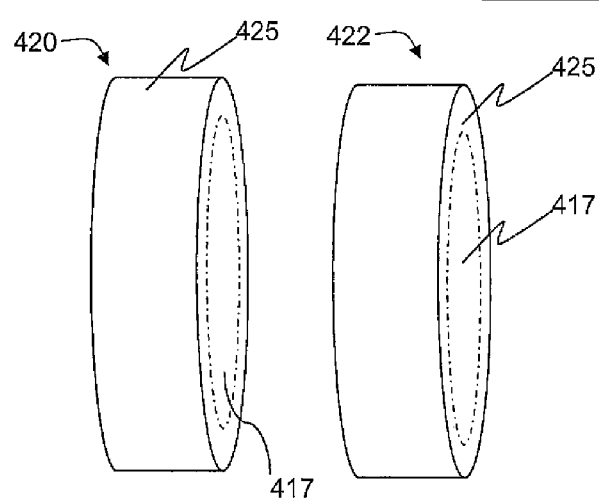

In one embodiment, a multifunctional thin disk lasing crystal can be prepared by hydrothermal epitaxial growth. The hydrothermal epitaxial growth method described here can allow for simple growth of a layer of doped material on host material as well as an edge cladding layer to suppress ASE. As illustrated in FIG. 7A, an undoped single crystal of YAG of between about 1 cm and about 2 cm in diameter and typically about 2 mm in thickness can be used as a seed crystal. The seed crystal can be placed in an autoclave with a feedstock of, e.g., Y$_2$O$_3$ and Al$_2$O$_3$ or YAG powder, along with a suitable concentration of a desired lasing ion, for example but not limited to about 10 at. % Yb$_2$O$_3$. Over several days, using hydrothermal methods, a layer 424 as illustrated in FIG. 7B can be grown on the undoped YAB seed crystal. The layer 424 can be, for instance, between about 100 and about 200 microns of about 10 at. % Yb doped YAG. This layer 424 can either be randomly oriented or oriented by growth on an oriented [100] seed crystal 416. The crystal can be removed from the autoclave and both large faces polished, and the seed crystal can be cut down its length to form two crystals 420, 422 as shown in FIG. 7C, each with a 1 mm undoped substrate 417 and a 100-200 micron thick layer 425 doped with Yb activator ions in 10 at. % concentration.

Figures 7D, 7E, 7F:
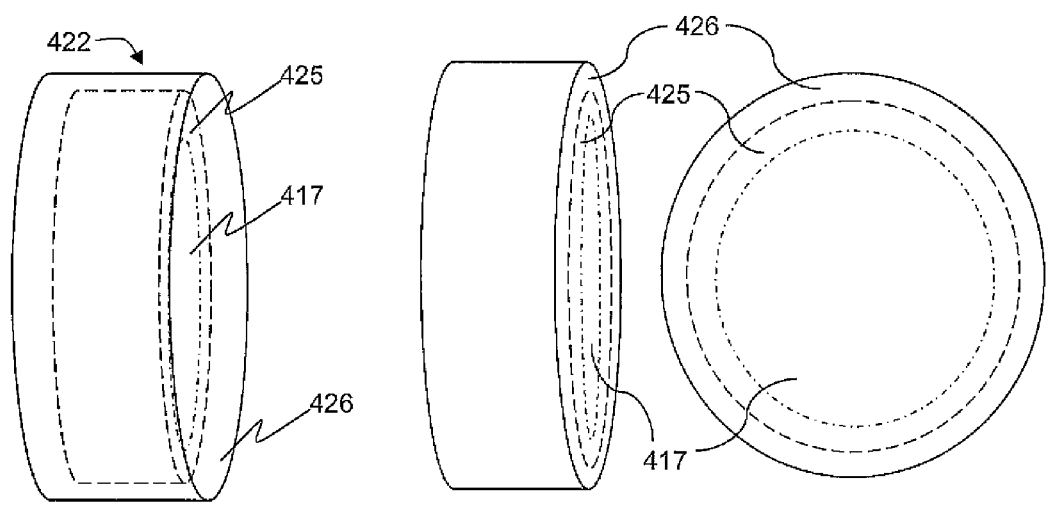

Following this, and as illustrated at FIG. 7D, a cladding layer 426 of Yb$^{3+}$ doped host with a significantly greater concentration of Yb$^{3+}$ (for instance from about 15 at. % to about 25 at. %) can be grown on the crystal on all the sides and edges to a thickness of one to two millimeters. The cladding layer 426 dopant can also be co-doped with a lower concentration of Er$^{3+}$ to quench the Yb$^{3+}$ excite state. Alternatively or in addition, the cladding layer 426 can be doped with any other metal ion appropriate for absorption for ASE suppression (for example Co$^{3+}$ or exess Ca$^{2+}$/Cr$^{4+}$). The top and bottom faces of the disk can then be subsequently polished to remove the deposited cladding layer, as shown in perspective at FIG. 7E and in a front view at FIG. 7F.

As a variation (not shown), an additional layer of undoped host material can be grown at the edge of a crystal, either before or after the ASE suppression region is grown. This undoped layer (for example, but not limited to, YAG) can be grown using the thin disk crystal as the seed and undoped YAG feedstock using the same hydrothermal growth conditions as described above. The layer of undoped material on the edge can serve to minimize any thermal distortion during high power operation.

Dopants for any region of a crystal are not limited to any particular ions described as examples herein. In general, the preferred identity of a dopant can depend upon the desired function of the region and the host material in the feedstock. For instance, in addition to $Nd^{3+}$ and $Yb^{3+}$, suitable activator ion dopants can include, without limitation, $Er^{3+}$, $Tm^{3+}$, $Ho^{3+}$, and the like. In general, all trivalent lanthanides (La to Yb, Sc and Y) and most other trivalent metal ions with gain active properties can be successfully doped into a YAG lattice using a hydrothermal growth method. Typically, all the rare earths from Ce to Yb can be incorporated into a trivalent host metal site as a dopant. Moreover, a region can include more than one dopant. For instance, a region can be formed of Yb,Er:YAG or Tm,Ho:YAG.

Elements of a host lattice can be varied as desired. For instance, elements of a host lattice can be varied to adjust the refractive index and overall lattice size. Materials can be introduced to a region using appropriate sources in the feedstock (typically the dopant oxide, but occasionally the halide or nitrate salt). Other metal ions can be introduced as required by the desired function of the formed crystal regime. For example $Ga^{3+}$ can be added to one of the layers replacing an equal amount of $Al^{3+}$, which would increase the size of the crystal lattice to match the size of another epitaxial layer. Similarly an element can be added to increase the index of refraction to match another layer. For example, $Lu^{3+}$ can replace $Y^{3+}$ in a host YAG lattice to decrease the size of the host lattice or alternatively to increase the refractive index of the crystal.

In one embodiment, a dopant ion can replace an optically inactive ion with a different charge. In such an embodiment another ion may also be introduced simultaneously to balance the charge in the lattice, as is generally known in the art. Thus $Cr^{4+}$ may be added to YAG (replacing $Al^{3+}$ in the host lattice) so $Ca^{2+}$ or $Mg^{2+}$ can be added to replace $Y^{3+}$, maintaining a net charge balance in the crystal lattice. Similarly $Co^{2+}$ can be added to replace $Al^{3+}$ to serve as a saturable absorber Q switch for 1.5 micron eye safe laser wavelength so $Si^{4+}$ can be added in equimolar amounts to replace $Al^{3+}$ and achieve charge balance in the lattice.

The present disclosure is also directed to products incorporating heterogeneous monolithic crystals as may be formed according to disclosed methods. For instance, a monolithic heterogeneous crystal as disclosed herein can be incorporated into a microlaser device and end-pumped solid-state laser device, a side pumped solid-state laser device, a thin disk laser device (typically used in high energy applications) or an amplifier crystal used in a laser device.

While certain embodiments of the disclosed subject matter have been described using specific terms, such description is for illustrative purposes only, and it is to be understood that changes and variations may be made without departing from the spirit or scope of the subject matter.

What is claimed is:

1. A monolithic heterogeneous single crystal comprising a lasing region and an amplified spontaneous emission (ASE) suppression region, the lasing region and the ASE suppression region including the same host material, the lasing region including an active lasing ion dopant at a constant concentration throughout the lasing region, and the ASE suppression region including an ASE suppression ion dopant at a constant concentration throughout the ASE suppression region, the lasing region having a laser path, wherein the ASE suppression region is a cladding that is external to the lasing region and the lasing path does not intersect the ASE suppression region.

2. The monolithic heterogeneous single crystal of claim 1, wherein the host material is a garnet, a vanadate, a rare earth sesquioxide, a spinel, or a borate.

3. The monolithic heterogeneous single crystal of claim 1, wherein the active lasing ion dopant is $Nd^{3+}$ or $Yb^{3+}$.

4. The monolithic heterogeneous single crystal of claim 1, further comprising a second dopant in the lasing region and/or in the ASE suppression region.

5. The monolithic heterogeneous single crystal of claim 1, wherein the ASE suppression ion dopant is an absorber ion for the active lasing ion.

6. The monolithic heterogeneous single crystal of claim 5, wherein the ASE suppression ion dopant is $Sm^{3+}$, $Co^{3+}$, $Cr^{4+}$, $Dy^{3+}$ or $Cu^{2+}$.

7. The monolithic heterogeneous single crystal of claim 1, wherein the ASE suppression ion dopant is the same ion as the active lasing ion dopant, the ASE suppression region including the ASE suppression ion dopant in a concentration that is higher than the concentration of the active lasing ion dopant in the lasing region.

8. The monolithic heterogeneous single crystal of claim 1, further comprising one or more additional regions, each of which including the host material.

9. The monolithic heterogeneous single crystal of claim 8, wherein the one or more additional regions include a Q-switch region.

10. The monolithic heterogeneous single crystal of claim 8, wherein the one or more additional regions include a region comprising the host material with no dopants.

11. The monolithic heterogeneous single crystal of claim 8, wherein an additional region is immediately adjacent to a first portion of the lasing region and the ASE suppression region is immediately adjacent to a second portion of the lasing region.

12. The monolithic heterogeneous single crystal of claim 1, wherein the monolithic heterogeneous single crystal is in the shape of a plate, a rod, or a thin disk.

13. The monolithic heterogeneous single crystal of claim 1, wherein the lasing region and the ASE suppression region have the same Miller index value.

14. The monolithic heterogeneous single crystal of claim 8, the one or more additional regions comprising undoped end caps.

15. A device incorporating the monolithic heterogeneous single crystal of claim 1.

16. The device of claim 15, wherein the device is a Q-switched pulsed laser, a diode pumped microlaser, or a laser amplifier.

* * * * *